United States Patent
Tsai et al.

(10) Patent No.: US 9,625,822 B2
(45) Date of Patent: Apr. 18, 2017

(54) MECHANISMS FOR PERFORMING A PHOTOLITHOGRAPHY PROCESS WITH A SURFACE MODIFYING TREATMENT ON AN EXPOSED PHOTORESIST LAYER

(71) Applicant: TAIWAN SEMICONDUCTOR MANUFACTURING CO., LTD., Hsin-Chu (TW)

(72) Inventors: Chi-Cheng Tsai, New Taipei (TW); Hung-Chi Wu, Hsinchu (TW); Tsung-Chuan Lee, Taipei (TW); Chung-Hsien Lin, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 217 days.

(21) Appl. No.: 14/067,167

(22) Filed: Oct. 30, 2013

(65) Prior Publication Data
US 2015/0116679 A1   Apr. 30, 2015

(51) Int. Cl.
*G03F 7/38* (2006.01)
*G03F 7/20* (2006.01)

(52) U.S. Cl.
CPC ............. *G03F 7/38* (2013.01); *G03F 7/2024* (2013.01); *G03F 7/70341* (2013.01)

(58) Field of Classification Search
CPC .... G03F 7/0048; G03F 7/0382; G03F 7/0392; G03F 7/168; G03F 7/38
See application file for complete search history.

(56) References Cited

U.S. PATENT DOCUMENTS

| | | | |
|---|---|---|---|
| 6,096,469 A * | 8/2000 | Anderson et al. | 427/256 |
| 6,472,127 B1 * | 10/2002 | Takizawa | 430/322 |
| 2003/0077983 A1 * | 4/2003 | Hagan | C03C 15/00 451/37 |
| 2006/0008736 A1 * | 1/2006 | Kanda | G03F 7/0045 430/270.1 |
| 2006/0078823 A1 * | 4/2006 | Kanda et al. | 430/270.1 |
| 2008/0299487 A1 * | 12/2008 | Chang | G03F 7/2041 430/270.1 |
| 2009/0280434 A1 * | 11/2009 | Harada et al. | 430/270.1 |
| 2010/0203250 A1 * | 8/2010 | Sato et al. | 427/402 |
| 2010/0291491 A1 * | 11/2010 | Yamamoto et al. | 430/423 |

* cited by examiner

*Primary Examiner* — Michelle M Iacoletti
(74) *Attorney, Agent, or Firm* — Birch, Stewart, Kolasch & Birch, LLP

(57) ABSTRACT

Embodiments of performing a photolithography process are provided. The method for performing the photolithography process includes providing a substrate and forming a photoresist layer over the substrate. The method further includes forming exposed photoresist portions by performing an exposure process on the photoresist layer. The method further includes performing a surface modifying treatment on the photoresist layer after the exposure process and removing the exposed photoresist portions by performing a developing process.

19 Claims, 4 Drawing Sheets

MECHANISMS FOR PERFORMING A PHOTOLITHOGRAPHY PROCESS WITH A SURFACE MODIFYING TREATMENT ON AN EXPOSED PHOTORESIST LAYER

BACKGROUND

Integrated circuit (IC) technologies are constantly being improved. Such improvements frequently involve scaling down device geometries to achieve lower fabrication costs, higher device integration density, higher speeds, and better performance.

Lithography is a mechanism by which a pattern on a mask is projected onto a material layer. As feature sizes decrease, immersion lithography, in which the exposure procedure is performed with a liquid filling the space between the material layer and lens, is often used. Using immersion lithography allows for higher numerical apertures (NA) than when using lenses in air, and therefore, provides for improved resolution. Furthermore, immersion lithography provides enhanced depth-of-focus (DOF) for printing smaller features.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
FIGS. 1A to 1E illustrate cross-section representations of various stages when performing a photolithography process in accordance with some embodiments.

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Mechanisms for performing a photolithography process are provided in accordance with some embodiments of the disclosure. FIGS. 1A to 1E illustrate cross-section representations of various stages of performing a photolithography process in accordance with some embodiments. In the photolithography process, a substrate 102 is disposed over a stage 104, as show in FIG. 1A in accordance with some embodiments.

Stage 104 may be a substrate stage or a portion of a substrate stage. Stage 104 may be operable to secure and move substrate 102 during the photolithography process. It should be noted that stage 104 may include various applicable components for performing precise movements, although the components are not shown in FIG. 1A.

Substrate 102 held by stage 104 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

Alternatively, substrate 102 may include non-semiconductor materials. For example, substrate 102 is a glass plate for thin-film-transistor liquid crystal display (TFT-LCD) devices, a substrate for a photomask (e.g., quartz), a material suitable to provide substrates for devices such as microelectromechanical (MEMS) devices (e.g., glass/quartz), and/or other applicable substrates.

In some embodiments, substrate 102 includes structures such as doped regions including wells and a source/drain, isolation features including shallow trench isolation (STI) and inter-level dielectric (ILD) layers, and/or conductive features including gate electrodes, metal lines, vias, and contacts. In addition, substrate 102 may further include one or more material layers to be patterned. For example, the one or more material layers to be patterned include a silicon layer, a dielectric layer, and/or a doped poly-silicon layer. In some embodiments, substrate 102 is a device wafer.

Figure 1B:

A photoresist layer 106 is formed over substrate 102, as shown in FIG. 1B in accordance with some embodiments. In some embodiments, photoresist layer 106 is a positive photoresist and includes a polymer which is photo-solubilized when exposed to light. In some embodiments, photoresist layer 106 is a chemical amplifier resist (CAR) layer. In some embodiments, photoresist layer 106 is made of phenol-formaldehyde novolak resins. In some embodiments, photoresist layer 106 is made of a material having the following formula:

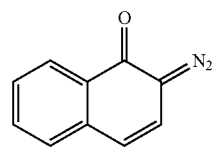

In addition, photoresist layer 106 may further include a solvent, a sensitizer, and/or other additives. The solvent may allow photoresist layer 106 to be coated on substrate 102. The solvents may be organic solvents, such as ethyl cellosolve acetate, ethoxyethyl acetate, diglyme, or cyclohexanone. The sensitizer may control the photochemical reactions during the photolithography process. In addition, the sensitizer may also be used to broaden or narrow the wavelength response of photoresist layer 106. The additives may be used to facilitate the processing steps or to enhance material properties of photoresist layer 106, depending on specific application needs. In some embodiments, a thickness of photoresist layer 106 is in a range from about 500 A to about 6000 A. In some embodiments, photoresist layer 106 is formed by spin-on coating.

Additionally, a bake process may be applied to photoresist layer 106 in accordance with some embodiments. In some embodiments, the bake process is a soft baking process. The bake process may be used to remove the solvent in photoresist layer 106.

Figure 1C:
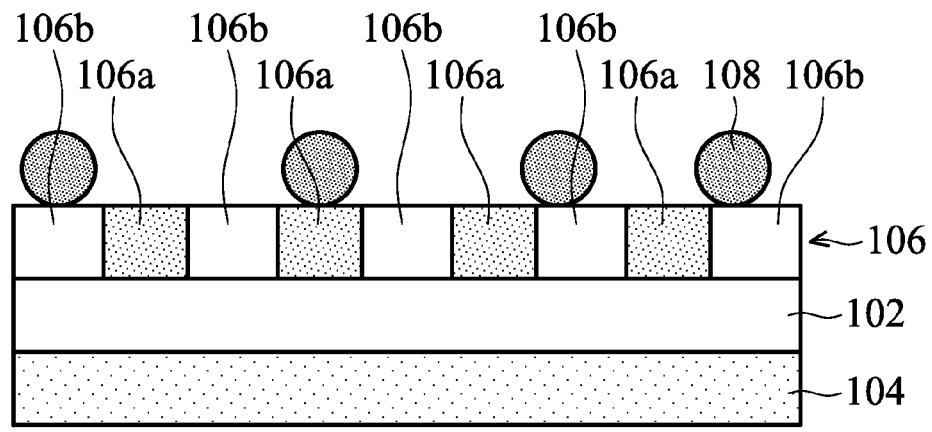

Next, an exposure process is performed to photoresist layer 106. The exposure process may include exposing photoresist layer 106 to radiation. In some embodiments, photoresist layer 106 is exposed to radiation through a mask. The mask may have a predefined pattern, and therefore after the exposure process, photoresist layer 106 also has the same pattern. As shown in FIG. 1C, after the exposure process, photoresist layer 106 includes exposed photoresist portions 106a and unexposed photoresist portions 106b in accordance with some embodiments. In some embodiments, exposed photoresist portions 106a become soluble due to a developer used in a sequential process, while unexposed photoresist portions 106b remains insoluble to the developer. In some embodiments, exposed photoresist portions 106a undergo the following reaction:

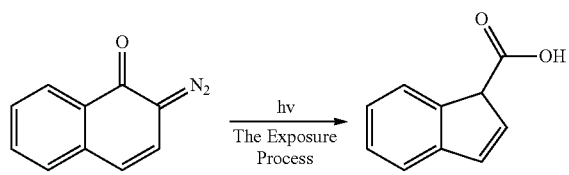

The radiation may be an ultraviolet light or extra UV (EUV) light source. For example, the radiation may come from a mercury lamp having a wavelength of 436 nm (G-line) or 365 nm (I-line), a Krypton Fluoride (KrF) excimer laser with wavelength of 248 nm, an Argon Fluoride (ArF) excimer laser with a wavelength of 193 nm, a Fluoride (F2) excimer laser with a wavelength of 157 nm, or other light sources having an applicable wavelength (e.g., below approximately 100 nm). Photoresist layer 106 may be exposed to the radiation for a predetermined amount of time, depending on the material of photoresist layer 106 used in the lithography process, the intensity of the radiation source, and/or other factors.

In some embodiments, the exposure process is an immersion lithography process. For example, substrate 102 is immersed in an immersion fluid. More specifically, the immersion fluid is introduced into a space between photoresist layer 106 and the lens of the immersion lithography system. Therefore, the immersion fluid is in direct contact with photoresist layer 106 during the exposure process.

In some embodiments, the immersion fluid includes de-ionized water (DI water). In some embodiments, the immersion fluid further includes other applicable additives. In addition, a hard baking process may further be performed after the exposure process. A temperature and baking time of the baking process (e.g. post exposure baking; PEB) may be adjusted depending on applications.

As shown in FIG. 1C, although most of the immersion fluid is removed from photoresist layer 106 after the exposure process is performed, residues 108 are still left over on photoresist layer 106. In some embodiments, residues 108 include DI water used as the immersion fluid during the exposure process. In some embodiments, residues 108 further include photoresist materials leaching from photoresist layer 106.

Figure 2:
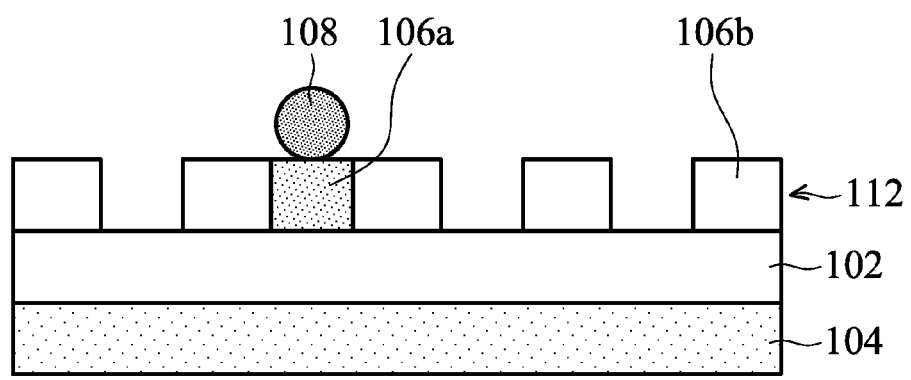
FIG. 2 illustrates a cross-section representation when performing a photolithography process in accordance with some embodiments.

Residues 108 may decrease the performance of the image patterning in sequential processes. For example, blind hole defect may occur. More specifically, after the exposure process (e.g. immersion lithography process), one or more exposed photoresist portions 106a, which should be removed by the developer used afterwards, is blocked by residues 108 and therefore is or are not removed by the developer, as shown in FIG. 2 in accordance with some embodiments. Therefore, photoresist layer 106 is not patterned as mask designed, and the resulting patterned photoresist layer 112 does not have the desired pattern (i.e. predetermined pattern).

Figure 1D:
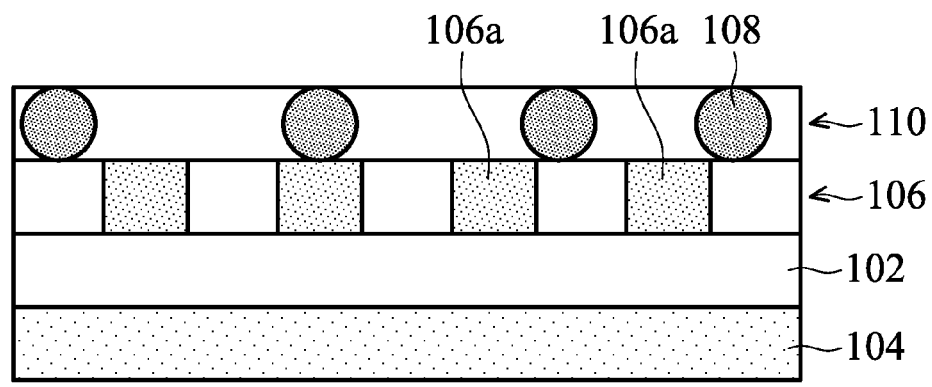

Accordingly, a surface modifying treatment is performed after the exposure process, in accordance with some embodiments. The surface modifying treatment is configured to assist in removal of residues 108. In some embodiments, the surface modifying treatment includes coating a surfactant layer 110 on a top surface of photoresist layer 106, as shown in FIG. 1D in accordance with some embodiments.

In some embodiments, surfactant layer 110 is formed by a mixing solution containing a surfactant. In some embodiments, a pH value of the mixing solution is in a range from about 8 to about 14. In some embodiments, an amount of the mixing solution used to form surfactant layer 110 is in a range from about 20 mL to about 50 mL.

In some embodiments, surfactant layer 110 is formed by a mixing solution including a cationic surfactant, an anionic surfactant, a zwitterionic surfactant, or a non-ionic surfactant. Examples of the surfactant in surfactant layer 110 may include, but are not limited to, ammonium lauryl sulfate, sodium dodecyl sulfate, octenidine dihydrochloride, alkyltrimethylammonium salts, glucoside alkyl etherspolyoxyethylene glycol alkyl ethers, coupling agent, carboxyl polydimethylsiloxane, hydroxyl polydimethylsiloxane, carboxyl polyphenylene siloxane, hydroxyl polyphenylene siloxane, or other applicable surfactants. In some embodiments, surfactant layer 110 is formed by the mixing solution including amide salt, alcohol salt, diol, and ammonium hydroxide. In some embodiments, a concentration of ammonium hydroxide in the mixing solution is in a range from about 65% to about 80%. In some embodiments, a total concentration of amide salt, alcohol salt, and diol in the mixing solution is in a range from about 20% to about 35%.

In some embodiments, surfactant layer 110 is formed over photoresist layer 106 by a spin coating process. In some embodiments, a spin speed of the spin coating process is in a range from about 500 rpm to about 2500 rpm. In some embodiments, a flow rate of the mixing solution during the spin coating process is in a range about 250 cc/min to about 350 cc/min. In some embodiments, a performing time of the surface modifying treatment is in a range from about 4 seconds to about 25 seconds. In some embodiments, a spin dry process is further performed after the spin coating process.

In some embodiments, a contact angle of photoresist layer 106 increases after the surface modifying treatment is performed. For example, the contact angle of photoresist layer 106 before the surface modifying treatment is in a range from about 70° to about 76°, and the contact angle of photoresist layer 106 after the surface modifying treatment is in a range from about 75° to about 81°. In some embodiments, a difference in the contact angle of photoresist layer 106 before and after the surface modifying treatment is in a range from about 2° to about 5°. Removal of residues 108 from photoresist layer 106 having a larger contact angle may be easier than removal of residues 108 from photoresist layer 106 without surface treatment.

Figure 1E:
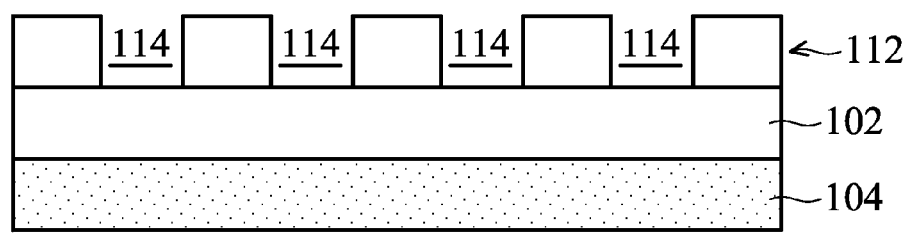

After the surface modifying treatment, a developing process is performed in accordance with some embodiments. As shown in FIG. 1E, exposed photoresist portions 106a and surfactant layer 110 are both removed by the developing process. In addition, residues 108 are also removed along with surfactant layer 110 before the developing process. In some embodiments, the developing process includes using a developer. In some embodiments, the developer is a tetramethylammonium hydroxide (TMAH) based solution. In some embodiments, the developer is 2.38+/−0.002 wt % of TMAH.

In some embodiments, exposed photoresist portions 106a are dissolved by the developer, and therefore patterned photoresist layer 112 is formed. Patterned photoresist layer 112 has one or more openings 114 formed by removal of exposed photoresist portions 106a, and portions of substrate 102 are exposed through openings 114. In some embodiments, surfactant layer 110 is also dissolved in the developer.

As shown in FIG. 1E, with the assistance of surfactant layer 110, residues 108 are completely removed by the developing process. Therefore, blind hole defect is prevented. In addition, surfactant layer 110 may also facilitate exposed photoresist portions 106a to dissolve in the developer.<

As shown in FIG. 1E, since the top surface of photoresist layer 106 is modified by a surface modifying treatment, residues 108 can be completely removed by the developer. Therefore, the resulting patterned photoresist layer 112 has the exact pattern as designed.

After the developing process, other processes may further be performed. For example, an etching process is performed to pattern substrate 102 through patterned photoresist layer 112. Afterwards, patterned photoresist layer 112 is removed by a wet stripping process. In some embodiments, a semiconductor substrate is patterned. In some other embodiments, a glass substrate for thin film transistor liquid crystal display (TFT LCD) devices or a transparent substrate (such as fused quartz) for a photomask may be patterned using the method described above.

Alternatively, an implanting process may be performed after the developing process. For example, dopants are implanted to substrate 102 through patterned photoresist layer 112, and patterned photoresist layer 112 is removed afterwards.

Figure 3:
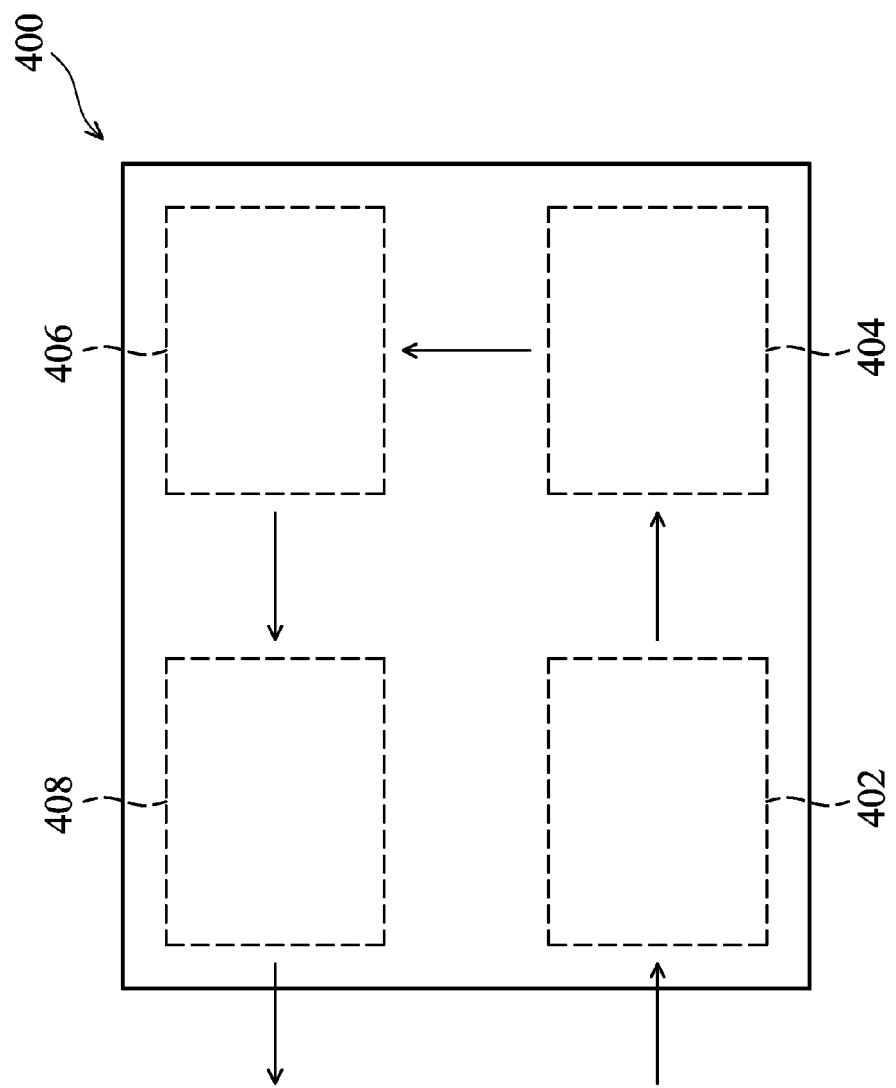
FIG. 3 illustrates a photolithography system in accordance with some embodiments.

The photolithography process described above is performed in a photolithography system 400, as shown in FIG. 3 in accordance with some embodiments. Photolithography system 400 includes a photoresist forming zone 402, an exposure zone 404, a surface modifying zone 406, and a developing zone 408. In some embodiments, photolithography system 400 further includes stage 104 (not shown in FIG. 3, referring to FIG. 1A), which is configured to transfer substrate 102 from one zone to another. More specifically, stage 104 is configured to transfer substrate 102 from photoresist forming zone 402, an exposure zone 404, a surface modifying zone 406, to a developing zone 408 in sequence.

In the photolithography process, substrate 102 is secured on stage 104 and is transferred to photoresist forming zone 402. In photoresist forming zone 402, photoresist layer 106 is coated on substrate 102. Afterwards, substrate 102 is transferred to exposure zone 404 to perform the exposure process. In some embodiments, an immersion lithography module (not shown) is disposed in exposure zone 404 to perform the exposure process. After the exposure process, exposed photoresist portions 106a become soluble to the developer used afterwards.

Next, substrate 102 is transferred to surface modifying zone 406 to perform the surface modifying treatment. During the surface modifying treatment, surfactant layer 110 is formed over photoresist layer 106 in accordance with some embodiments. In some embodiments, a spin coater is disposed in surface modifying zone 406 to form surfactant layer 110 on the top surface of photoresist layer 106. The surface modifying treatment is performed to assist in the removal of residues 108 formed over photoresist layer 106.

Finally, substrate 102 is transferred to developing zone 408 to perform the developing process. After the developing process, patterned photoresist layer 112 is formed over substrate 102.

By sending substrate 102 to surface modifying zone 406 to perform the surface modifying treatment, defects of patterned photoresist layer 112 are decreased, and therefore the process window become healthier and enlarger.

As described previously, in some embodiments, the immersion lithography process is used to expose photoresist layer 106. Residues 108, such as water marks, are formed over photoresist layer 106 even when the immersion solution is expelled. Residues 108 tend to block the formation of the pattern in photoresist layer 106 (e.g. exposed photoresist portion 106a), resulting in blind hole defects. However, by performing the surface modifying treatment, residues 108 over photoresist layer 106 are removed by the developer easily. Therefore, photoresist layer 106 is precisely patterned to form patterned photoresist layer 112 as designed. Accordingly, the yield of the photolithography process is improved. In addition, the surface modifying treatment is low cost and can easily be adapted to present procedures. Therefore, additional complicated and/or expensive processes are not required.

Embodiments of mechanisms for performing a photolithography process are provided. The photolithography process includes a surface modifying process. The surface modifying process is performed after an exposure process is performed and facilitates in removal of residues resulting from the exposure process. Therefore, blind hole defect is prevented, and image patterning performance is improved. In addition, the surface modifying process can be adapted to present photolithography processes easily with low cost.

In some embodiments, a method for performing a photolithography process is provided. The method for performing the photolithography process includes providing a substrate and forming a photoresist layer over the substrate. The method further includes forming exposed photoresist portions by performing an exposure process on the photoresist layer. The method further includes performing a surface modifying treatment on the photoresist layer after the exposure process and removing the exposed photoresist portions by performing a developing process.

In some embodiments, another method for performing a photolithography process is provided. The method for performing the photolithography process includes providing a substrate and forming a photoresist layer over the substrate. The method further includes exposing the photoresist layer and forming exposed photoresist portions by performing an immersion lithography process. The method further includes coating a surfactant layer over the photoresist layer by a spin coating process after the exposure process and forming a patterned photoresist layer by performing a developing process.

In some embodiments, a photolithography system is provided. The photolithography system includes a surface modifying zone, a developing zone, and a stage. The stage is configured to transfer a substrate from the photoresist coating zone, to the exposure zone, the surface modifying zone, and the developing zone in sequence Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   forming a photoresist layer over a substrate;
   forming exposed photoresist portions in the photoresist layer and residues over the substrate by performing an immersion lithography process on the photoresist layer, wherein an immersion solution of the immersion lithography process includes water;
   coating a surfactant layer over the photoresist layer and over the residues, wherein the surfactant layer is formed by a mixing solution comprising an amide salt, an alcohol salt, a diol, and ammonium hydroxide, and a concentration of ammonium hydroxide in the mixing solution is in a range from about 65% to about 80%, and a total concentration of amide salt, alcohol salt, and diol in the mixing solution is in a range from about 20% to about 35%; and
   removing the exposed photoresist portions, the residues, and the surfactant layer by performing a developing process,
   wherein the residues comprise a photoresist material leaching from the photoresist layer.

2. The method as claimed in claim 1, wherein the surfactant layer is coated by a spin coating process.

3. The method as claimed in claim 1, wherein the surfactant layer comprises a mixing solution including an anionic surfactant, a zwitterionic surfactant, or a non-ionic surfactant.

4. The method as claimed in claim 1, wherein the surfactant layer is formed by a mixing solution, and a pH value of the mixing solution is in a range from about 8 to about 14.

5. The method as claimed in claim 1, wherein the water is de-ionized water.

6. The method as claimed in claim 1, wherein the surfactant layer comprises a zwitterionic surfactant.

7. The method as claimed in claim 1, wherein the surfactant layer comprises a non-ionic surfactant.

8. A method, comprising:
   forming a photoresist layer over a substrate;
   exposing the photoresist layer and forming exposed photoresist portions by performing an immersion lithography process, wherein an immersion solution of the immersion lithography process includes water, and residues are left over the substrate after the immersion solution is removed from the photoresist layer;
   coating a surfactant layer over the photoresist layer after the exposure process, wherein the residues are covered by the surfactant layer; and
   forming a patterned photoresist layer by performing a developing process,
   wherein the residues comprise a photoresist material leaching from the photoresist layer, and the surfactant layer is formed by a mixing solution, and a pH value of the mixing solution is in a range from about 8 to about 14, and the exposed photoresist portions, the residues, and the surfactant layer are dissolved in a developer during the developing process.

9. The method as claimed in claim 8, wherein the surfactant layer is formed on a top surface of the photoresist layer.

10. The method as claimed in claim 8, wherein the surfactant layer is formed by spin coating a mixing solution comprising a mixing solution including an anionic surfactant, a zwitterionic surfactant, or a non-ionic surfactant.

11. The method as claimed in claim 8, further comprising:
    patterning the substrate through the patterned photoresist layer after the developing process is performed.

12. The method as claimed in claim 8, wherein the water is de-ionized water.

13. The method as claimed in claim 1, wherein the residues comprise water used in the immersion lithography process.

14. The method as claimed in claim 8, wherein the mixing solution comprises an amide salt, an alcohol salt, a diol, and ammonium hydroxide.

15. The method as claimed in claim 14, wherein a concentration of ammonium hydroxide in the mixing solution is in a range from about 65% to about 80%.

16. The method as claimed in claim 14, wherein a total concentration of amide salt, alcohol salt, and diol in the mixing solution is in a range from about 20% to about 35%.

17. A method, comprising:
    forming a photoresist layer over a substrate;
    forming exposed photoresist portions in the photoresist layer and residues over the photoresist layer by performing an immersion lithography process, wherein the residues comprises a photoresist material leaching from the photoresist layer;
    coating a surfactant layer over the photoresist layer and over the residues; and dissolving the exposed photoresist portions, the residues, and the surfactant layer by a developer used in a developing process, wherein the surfactant layer is formed by a mixing solution comprising an amide salt, an alcohol salt, a diol, and ammonium hydroxide, and a pH value of the mixing solution is in a range from about 8 to about 14.

18. The method as claimed in claim 17, wherein a concentration of ammonium hydroxide in the mixing solution is in a range from about 65% to about 80%.

19. The method as claimed in claim 17, wherein a total concentration of amide salt, alcohol salt, and diol in the mixing solution is in a range from about 20% to about 35%.

\* \* \* \* \*